United States Patent
Hu

(10) Patent No.: US 12,206,382 B2
(45) Date of Patent: Jan. 21, 2025

(54) BULK ACOUSTIC WAVE RESONATOR AND FABRICATION METHOD THEREOF

(71) Applicant: Shenzhen Newsonic Technologies Co., Ltd., Shenzhen (CN)

(72) Inventor: Weiwei Hu, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/542,897

(22) Filed: Dec. 18, 2023

(65) Prior Publication Data

US 2024/0162882 A1 May 16, 2024

(30) Foreign Application Priority Data

Nov. 1, 2023 (CN) .......................... 202311444386.0

(51) Int. Cl.
*H03H 3/02* (2006.01)
*H03H 9/05* (2006.01)
*H03H 9/10* (2006.01)
*H03H 9/17* (2006.01)

(52) U.S. Cl.
CPC ............ *H03H 3/02* (2013.01); *H03H 9/0523* (2013.01); *H03H 9/105* (2013.01); *H03H 9/173* (2013.01); *H03H 2003/021* (2013.01)

(58) Field of Classification Search
CPC .... H03H 2003/021; H03H 3/02; H03H 9/173; H03H 9/0523; H03H 9/105
USPC ........................................................ 310/344
See application file for complete search history.

(56) References Cited

U.S. PATENT DOCUMENTS

| | | | | |
|---|---|---|---|---|
| 5,953,469 | A * | 9/1999 | Zhou ..................... | G02B 6/3522 385/22 |
| 2008/0042524 | A1* | 2/2008 | Shibata .................. | H03H 9/105 29/25.35 |
| 2021/0028751 | A1* | 1/2021 | Hurwitz ............... | H03H 9/1014 |
| 2022/0103146 | A1* | 3/2022 | Wang ................ | H03H 9/02118 |
| 2022/0158616 | A1* | 5/2022 | Wang ................... | H03H 9/1035 |
| 2022/0285605 | A1* | 9/2022 | Fujii ...................... | H10N 30/88 |
| 2023/0080099 | A1* | 3/2023 | Weng ..................... | H03H 9/059 310/313 R |
| 2023/0097870 | A1* | 3/2023 | Weng ................ | H01L 21/02057 310/365 |
| 2023/0299737 | A1* | 9/2023 | Weng ..................... | H03H 9/174 310/365 |
| 2024/0072752 | A1* | 2/2024 | Weng ....................... | H03H 3/02 |

\* cited by examiner

*Primary Examiner* — J. San Martin
(74) *Attorney, Agent, or Firm* — Finnegan, Henderson, Farabow, Garrett & Dunner, LLP.

(57) ABSTRACT

A bulk acoustic wave (BAW) resonator includes a bottom substrate, a piezoelectric layer disposed above the bottom substrate, a cap wafer disposed above the piezoelectric layer, a top electrode disposed on the piezoelectric layer, a bottom electrode disposed below the piezoelectric layer, a first pad metal layer disposed on and electrically connected to the top electrode. a second pad metal layer disposed on and electrically connected to the bottom electrode, a top bonding layer disposed below the cap wafer, for bonding the cap wafer with the piezoelectric layer; and a bond contacting layer disposed between the top bonding layer and each one of the first pad metal layer and the second pad metal layer.

12 Claims, 23 Drawing Sheets

Step S1

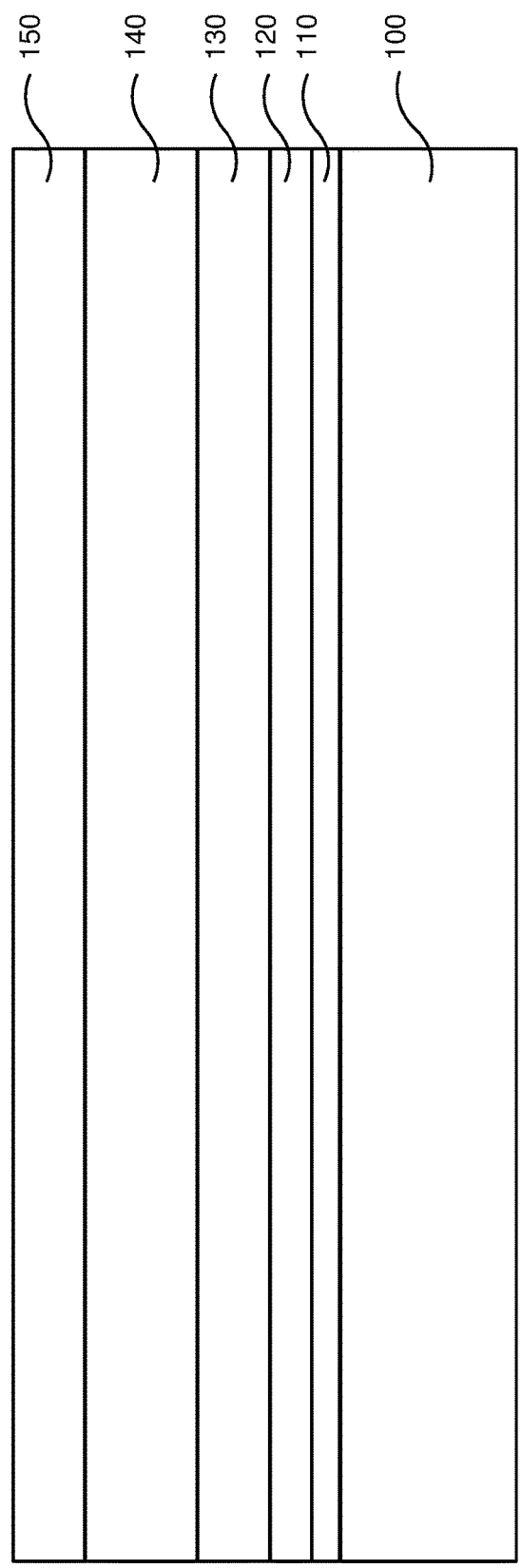

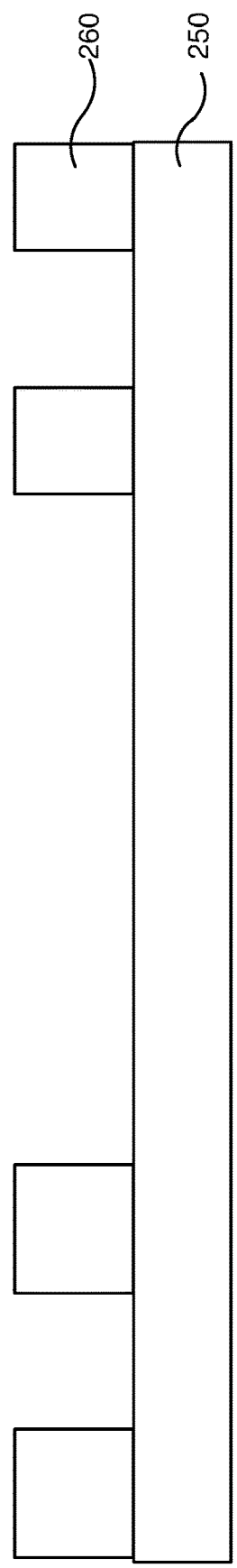

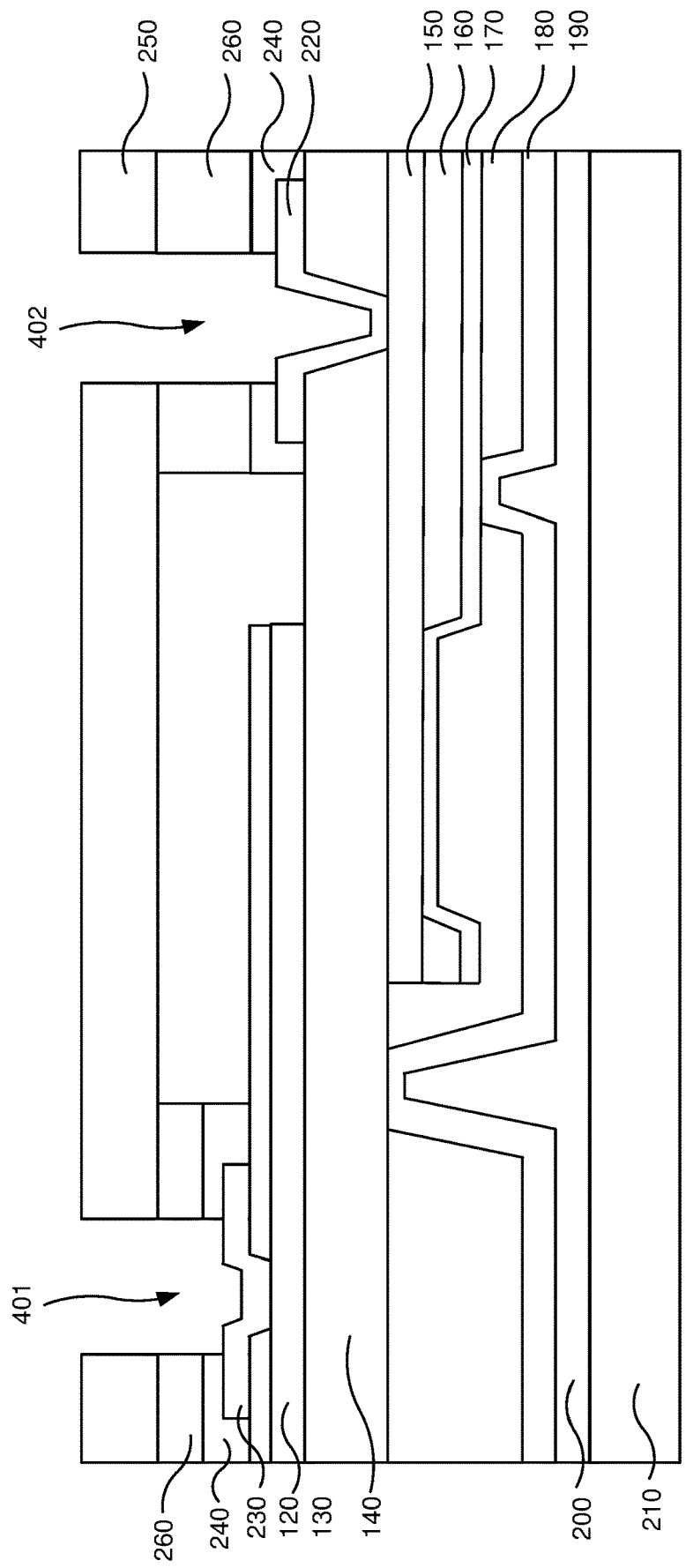

BULK ACOUSTIC WAVE RESONATOR AND FABRICATION METHOD THEREOF

CROSS-REFERENCE TO RELATED APPLICATIONS

The present application is based on and claims priority to Chinese Patent Application No. 202311444386.0, filed on Nov. 1, 2023, the entire contents of which are hereby incorporated by reference.

FIELD

The present disclosure relates to the field of semiconductor devices and, in particular, to a bulk acoustic wave resonator and a method of fabricating the bulk acoustic wave resonator.

BACKGROUND

A bulk acoustic wave resonator is a device including a thin film that is made of a piezoelectric material and disposed between two electrodes. The bulk acoustic wave resonator device is typically fabricated using semiconductor micro-processing technology.

Due to its small thickness, the bulk acoustic wave resonator device may be used in applications requiring high frequency, small size, and light weight. An exemplary application of the bulk acoustic wave resonator device is a bulk acoustic wave filter used in mobile communication devices.

The bulk acoustic wave filter may include two or more bulk acoustic wave resonators. It is desirable to form a bulk acoustic wave filter having a smaller size.

SUMMARY

According to one aspect of the disclosure, a bulk acoustic wave (BAW) resonator is provided. The BAW resonator includes a bottom substrate, a piezoelectric layer disposed above the bottom substrate, a cap wafer disposed above the piezoelectric layer, a top electrode disposed on the piezoelectric layer, a bottom electrode disposed below the piezoelectric layer, a first pad metal layer disposed on and electrically connected to the top electrode. a second pad metal layer disposed on and electrically connected to the bottom electrode, a top bonding layer disposed below the cap wafer, for bonding the cap wafer with the piezoelectric layer; and a bond contacting layer disposed between the top bonding layer and each one of the first pad metal layer and the second pad metal layer.

According to one aspect of the disclosure, a method for fabricating a bulk acoustic wave (BAW) resonator is provided. The method includes forming a top electrode layer, a piezoelectric layer, and a bottom electrode layer above a bottom substrate, forming a first pad metal layer that contacts the top electrode, forming a second pad metal layer that contacts the bottom electrode, forming a bond contacting layer that partially covers each one of the first pad metal layer and the second pad metal layer, forming a top bonding layer on a cap wafer, and bonding the cap wafer onto the piezoelectric layer via the bond contacting layer and the bonding layer.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1:
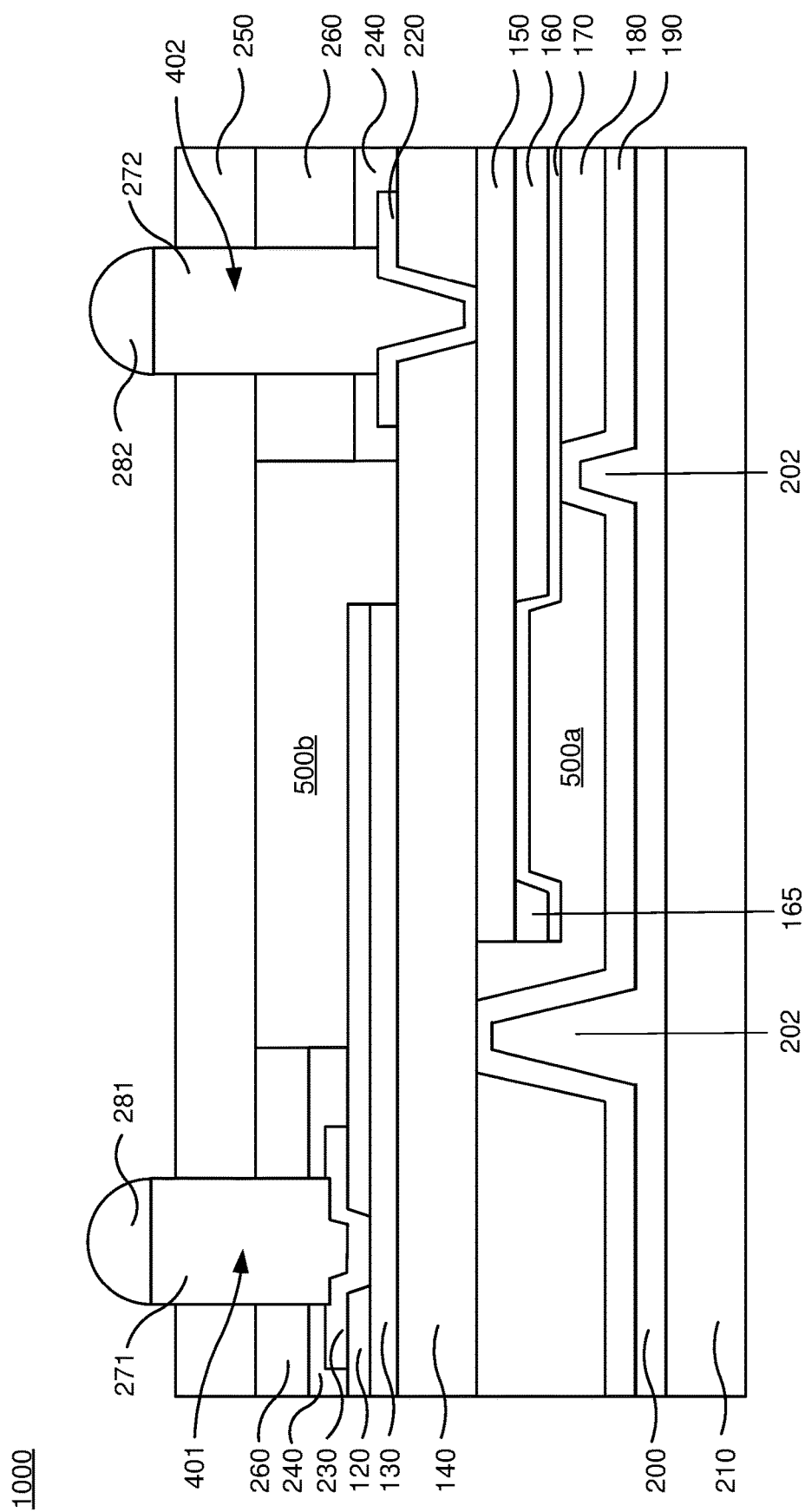
FIG. 1 is a cross-sectional view of a bulk acoustic wave (BAW) resonator, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top", "bottom", "upper", "lower", "above", "below", and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Generally, a thin film bulk acoustic wave (BAW) resonator may include a top electrode, a piezoelectric layer, a lower electrode, and at least one cavity disposed below or above the piezoelectric layer. In a cavity-release BAW structure, a bottom cavity is formed by using an etching and releasing process. During a wafer level packaging (WLP) process of the cavity-release resonator, gold-gold (Au—Au) bonding or dry film bonding is generally used for bonding a cap wafer to a bottom substrate. Since the cavity-release resonator generally uses buffered oxide etchant (BOE) or Dilute Hydrofluoric Acid (DHF) as an etching and releasing solution, gold (Au) is generally used as a pad metal layer in the BAW structure. If the bonding layer of BAW structure includes a dry film, the adhesion between the dry film and Au may be poor. As a result, dry film delamination might occur in subsequent fabrication processes.

In order to solve the problem of the poor adhesion between the dry film bonding layer and the Au pad metal layer, according to some embodiments of the present disclosure, a silicon nitride ($SiN_x$) or silicon oxide ($SiO_2$) layer is formed between the dry film bonding layer and the Au pad metal.

In addition, when the $SiN_x$ or $SiO_2$ layer directly contacts the Au pad metal layer, Au will dissolve with Si, and abnormal black spots will be formed on the surface of the pad metal layer. In order to solve this problem, according to some embodiments of the present disclosure, the composition of the pad metal layer is changed to include a chromium (Cr) layer at the interface between the Au layer and the $SiN_x$ or $SiO_2$ layer.

FIG. 1 is a cross-sectional view of a bulk acoustic wave (BAW) resonator 1000, according to an embodiment of the present disclosure.

As illustrated in FIG. 1, BAW resonator 1000 includes a bottom substrate 210, a piezoelectric layer 140 disposed above bottom substrate 210, a cap wafer 250 disposed above piezoelectric layer 140, a top electrode 130 disposed on piezoelectric layer 140, a bottom electrode 150 disposed below piezoelectric layer 140, a first pad metal layer 230 disposed on and electrically connected to top electrode 130, a second pad metal layer 220 disposed on and electrically connected to bottom electrode 150, a top bonding layer 260 disposed below cap wafer 250, for bonding cap wafer 250 with piezoelectric layer 140, and a bond contacting layer 240 disposed between top bonding layer 260 and each one of first pad metal layer 230 and second pad metal layer 220.

Bottom substrate 210 may include a material, such as silicon (Si), silicon carbon (SiC), aluminum oxide, quartz, glass ($SiO_2$), or sapphire ($Al_2O_3$).

Piezoelectric layer 140 may include a material with piezoelectric properties, such as aluminum nitride (AlN), zinc oxide (ZnO), lithium niobate (LiNbO3), lithium tantalate (LiTaO3), lead zirconate titanate (PZT), barium strontium titanate (BST), etc., or a stacked combination of two or more of those materials. When the material of piezoelectric layer 140 is aluminum nitride (AlN), the aluminum nitride may be doped with a certain proportion of rare earth elements, for example, scandium, erbium, lanthanum, etc.

Top and bottom electrodes 130 and 150 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of those conductive metal materials.

A frame layer 160 is disposed on at least a portion of a lower surface of bottom electrode 150. Frame layer 160 is used to form a raised structure 165 along an edge of bottom electrode 150. Raised structure 165 protrudes towards a bottom cavity 500a. Frame layer 160 may include a conductive material, which may be the same as the material of bottom electrode 150 or may be different from the material of bottom electrode 150. Additionally or alternatively, in an embodiment, frame layer 160 may be disposed on at least a portion of a top surface of top electrode 130, to form a raised structure along an edge of top electrode 130. The raised structure protrudes from top electrode 130 in a direction away from bottom electrode 150.

A top passivation layer 120 is disposed above, and covers a top surface of, top electrode 130. A bottom passivation layer 170 is disposed below, and covers bottom surfaces of, bottom electrode 150 and frame layer 160. Top passivation layer 120 may include aluminum nitride (AlN). Bottom passivation layer 170 may include a material such as silicon nitride (SiN), aluminum nitride (AlN), silicon oxide ($SiO_2$), silicon oxynitride (SiNO), etc., or a stacked combination of two or more of those materials.

A sacrificial layer 180 is disposed between bottom substrate 210 and piezoelectric layer 140. Sacrificial layer 180 may include silicon oxide ($SiO_2$). The bottom cavity 500a is formed in sacrificial layer 180.

A bottom bonding layer 200 is disposed between bottom substrate 210 and sacrificial layer 180. Bottom bonding layer 200 includes a protruding structure 202 surrounding bottom cavity 500a. Bottom bonding layer 200 may include silicon oxide, silicon nitride, etc., or a stacked combination of those materials.

A boundary layer 190 overlays bottom bonding layer 200. Boundary layer 190 may include non-conductive materials such as silicon (Si), silicon nitride (SiN), aluminum nitride (AlN), or a stacked combination of two or more of those materials. Boundary layer 190 contacts piezoelectric layer 140, or contacts bottom electrode 150 via frame layer 160 and bottom passivation layer 170. An edge of bottom electrode 150 is located inside bottom cavity 500a.

Top passivation layer 120 is provided with a top electrode contact window that exposes a portion of top electrode 130. A first pad metal layer 230 is disposed above top passivation layer 120 and is electrically connected to top electrode 130 via the top electrode contact window. Piezoelectric layer 140 is provided with a bottom electrode contact window that exposes a portion of bottom electrode 150. A second pad metal layer 220 is disposed above piezoelectric layer 140 and is electrically connected to bottom electrode 150 via the bottom electrode contact window.

Each one of first pad metal layer 230 and second pad metal layer 220 may include a stack of Cr/Au/Cr layers, or a stack of Ti/Au/Cr layers, arranged in an order from bottom to top. When each one of first pad metal layer 230 and second pad metal layer 220 includes the stack of Cr/Au/Cr layers, the stack of Cr/Au/Cr layers includes a first chromium (Cr) layer having a thickness of about several tens of nano meters (e.g., 30±20 nm) disposed on and contacting first pad metal layer 230 or second pad metal layer 220, a gold (Au) layer having a thickness of about several hundreds of nano meters to several micro meters (e.g., 1 µm±200 nm) disposed on the first Cr layer, and a second Cr layer having a thickness of about several tens of nano meters (e.g., 50±20 nm) disposed on the Au layer and contacting bond contacting layer 240. When each one of first pad metal layer 230 and second pad metal layer 220 includes the stack of Ti/Au/Cr layers, the stack of Ti/Au/Cr layers includes a Ti layer having a thickness of about several tens of nano meters (e.g., 30±20 nm) disposed on and contacting first pad metal layer 230 or second pad metal layer 220, an Au layer having a thickness of about several hundreds of nano meters to several micro meters (e.g., 1 µm±200 nm) disposed on the Ti layer, and a Cr layer having a thickness of about several tens of nano meters (e.g., 50±20 nm) disposed on the Au layer and contacting bond contacting layer 240.

Bond contacting layer 240 includes at least one of a silicon nitride ($SiN_x$) layer or a silicon oxide ($SiO_2$) layer. Top bonding layer 260 includes a dry film.

A top cavity 500b is disposed above piezoelectric layer 140 and covered by cap wafer 250. Top cavity 500b is surrounded by top bonding layer 260 and bond contacting layer 240. An edge of top electrode 130 is disposed within top cavity 500b.

A top electrode through hole 401 extends through cap wafer 250, top bonding layer 260, and bond contacting layer 240, and exposes a portion of first pad metal layer 230. A bottom electrode through hole 402 extends through cap wafer 250, top bonding layer 260, and bond contacting layer 240, and exposes a portion of second pad metal layer 220.

A first metal filling 271 is filled in top electrode through hole 401 and electrically connected to first pad metal layer 230. A second metal filling 272 is filled in bottom electrode through hole 402 and electrically connected to second pad metal layer 220. First and second metal fillings 271 and 272 may include a conductive metal material, such as copper (Cu).

A first solder bump 281 is disposed on first metal filling 271. A second solder bump 282 is disposed on second metal filling 272.

Figure 2:
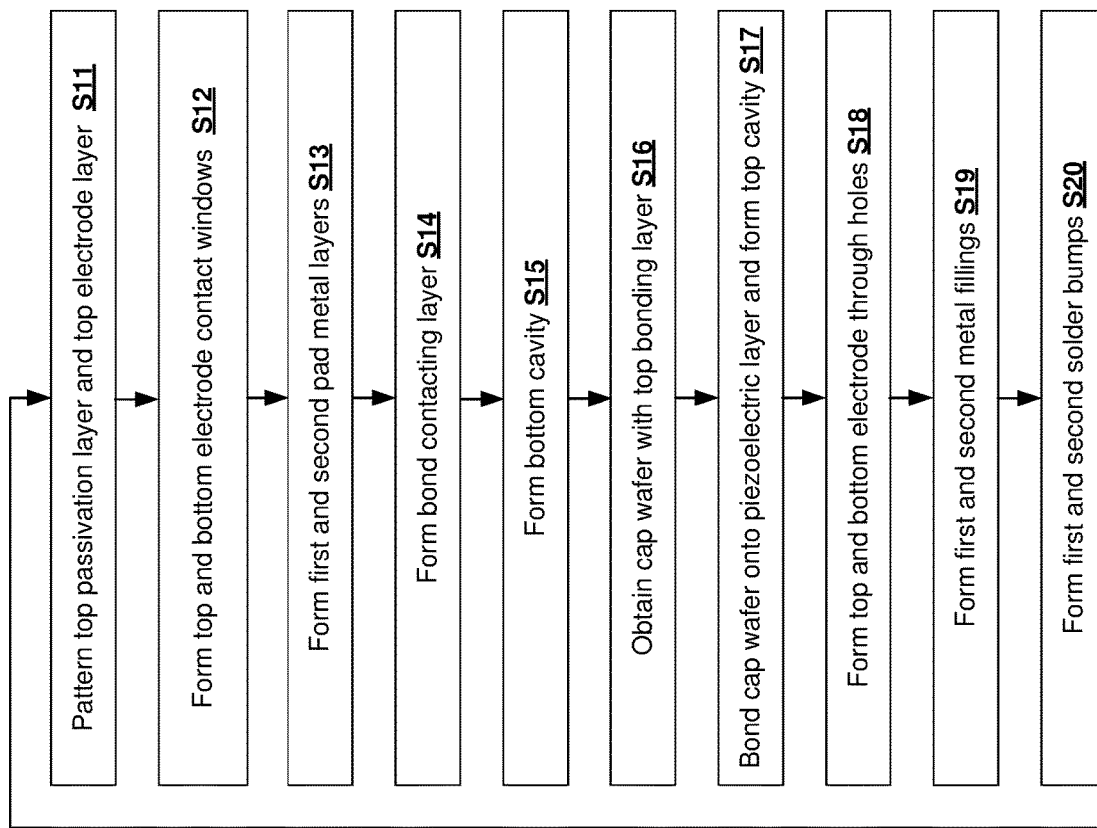
FIG. 2 is a flow chart of a process of fabricating a BAW resonator, according to an embodiment of the present disclosure.
Figure 3A:
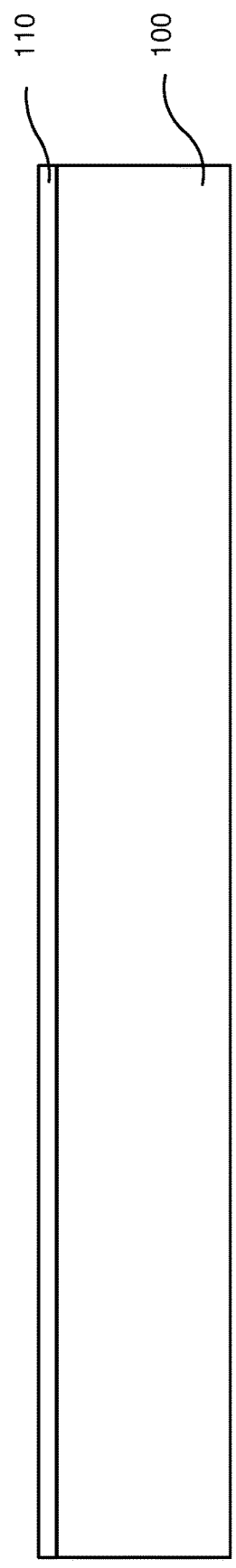
FIGS. 3A-3U are sectional views of structures formed in the process of FIG. 2, according to an embodiment of the present disclosure.

FIG. 2 is a flow chart of a process 2000 of fabricating BAW resonator 1000, according to an embodiment of the present disclosure. FIGS. 3A-3U are sectional views of structures formed in process 2000, according to an embodiment of the present disclosure.

As illustrated in FIGS. 2 and 3A, in step S1, a temporary substrate 100 is obtained, and a silicon oxide layer 110 is formed on temporary substrate 100. Temporary substrate 100 may include, for example, silicon (Si), silicon carbide (SiC), aluminum oxide, quartz, or glass, etc. Silicon oxide layer 110 may be obtained by oxidizing a silicon substrate, or may be deposited on temporary substrate 100 through a chemical vapor deposition (CVD) process.

As illustrated in FIGS. 2 and 3B, in step S2, a top passivation layer 120, a top electrode layer 130, a piezoelectric layer 140, and a bottom electrode layer 150 are sequentially deposited on silicon oxide layer 110. Top passivation layer 120 may include aluminum nitride (AlN). Top and bottom electrode layers 130 and 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, top and bottom electrode layers 130 and 150 include molybdenum (Mo). Piezoelectric layer 140 may include materials with piezoelectric properties or their stacked combination, such as aluminum nitride (AlN), zinc oxide (ZnO), lithium niobate (LiNbO3), lithium tantalate (LiTaO3), lead zirconate titanate (PZT), barium strontium titanate (BST), etc. When the material of piezoelectric layer 140 is aluminum nitride (AlN), the aluminum nitride itself may also be doped with a certain proportion of rare earth elements, such as scandium, erbium, lanthanum, etc.

Figure 3C:
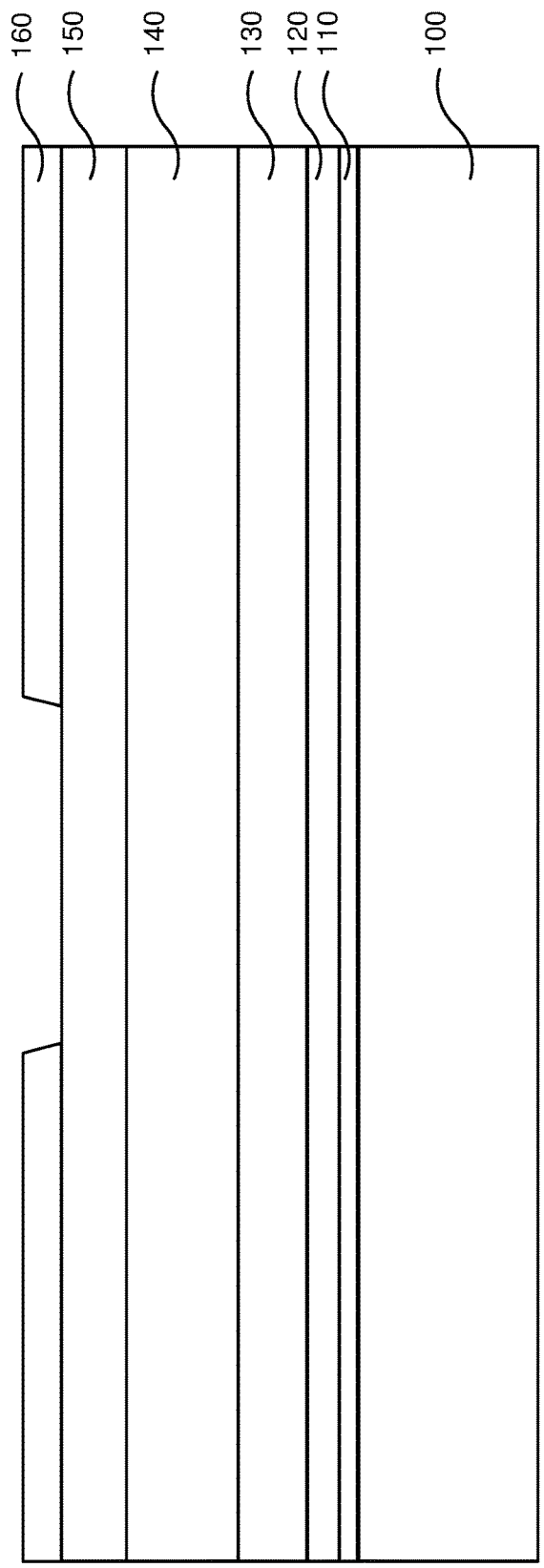

As illustrated in FIGS. 2 and 3C, in step S3, a frame layer 160 is formed on bottom electrode layer 150, and then frame layer 160 is patterned. Frame layer 160 may include a conductive material, which may be the same as the material of bottom electrode layer 150 or may be different from the material of bottom electrode layer 150. The patterning of frame layer 160 may be achieved either by using a Lift-off process or by using a patterned etching method.

Figure 3D:
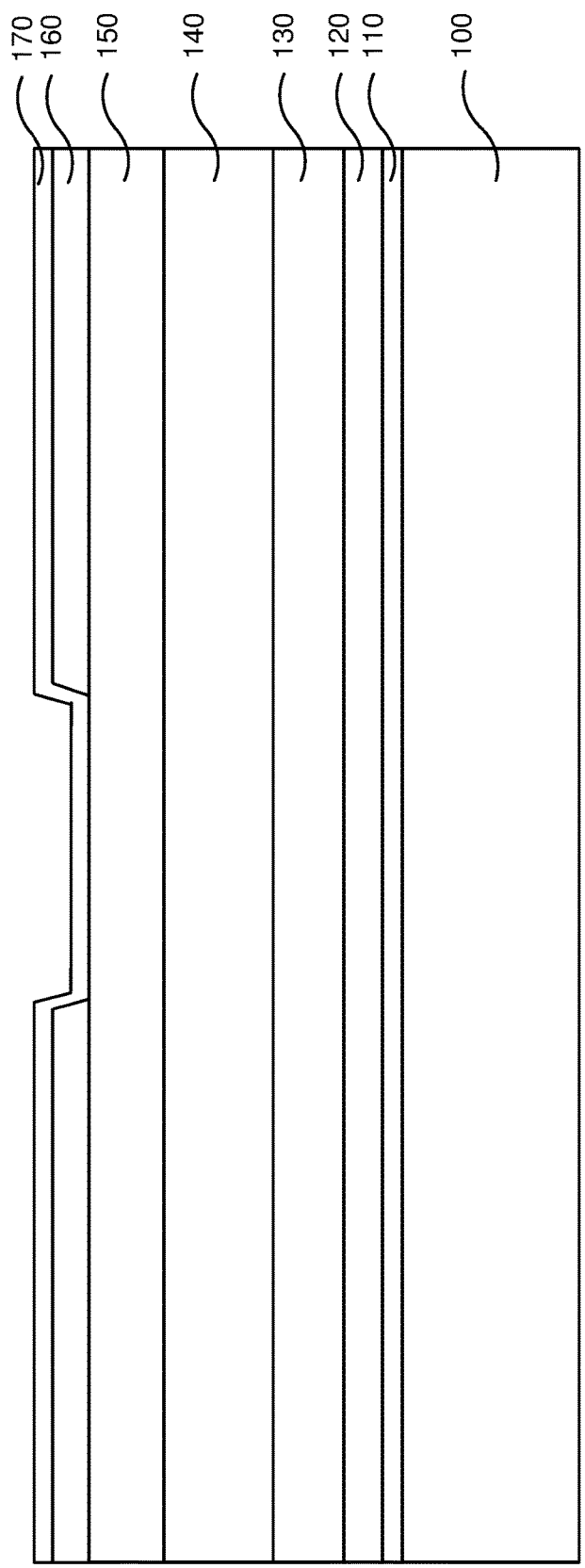

As illustrated in FIGS. 2 and 3D, in step S4, bottom passivation layer 170 is deposited on the surfaces of bottom electrode layer 150 and frame layer 160. The material of bottom passivation layer 170 may be silicon nitride (SiN), aluminum nitride (AlN), Silicon oxide (SiO2), silicon oxynitride (SiNO), or other materials, or a stacked combination of two or more of those materials.

Figure 3E:
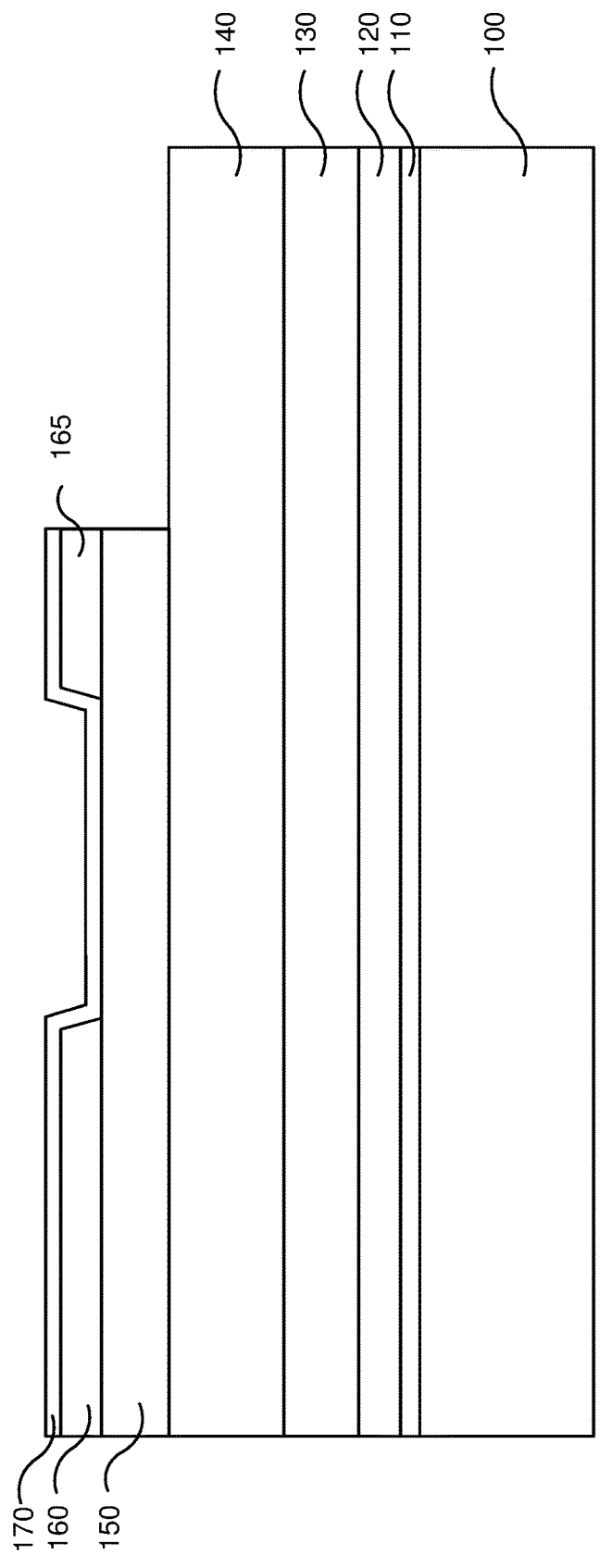

As illustrated in FIGS. 2 and 3E, in step S5, bottom passivation layer 170, frame layer 160, and bottom electrode layer 150 are patterned to form patterned bottom passivation layer 170, patterned frame layer 160, and patterned bottom electrode 150. The patterned frame layer 160 includes raised structure 165 at an edge of bottom electrode 150. The patterning may be achieved by etching, such as a plasma etching process, a wet chemical etching process, or a combination of the two.

Figure 3F:
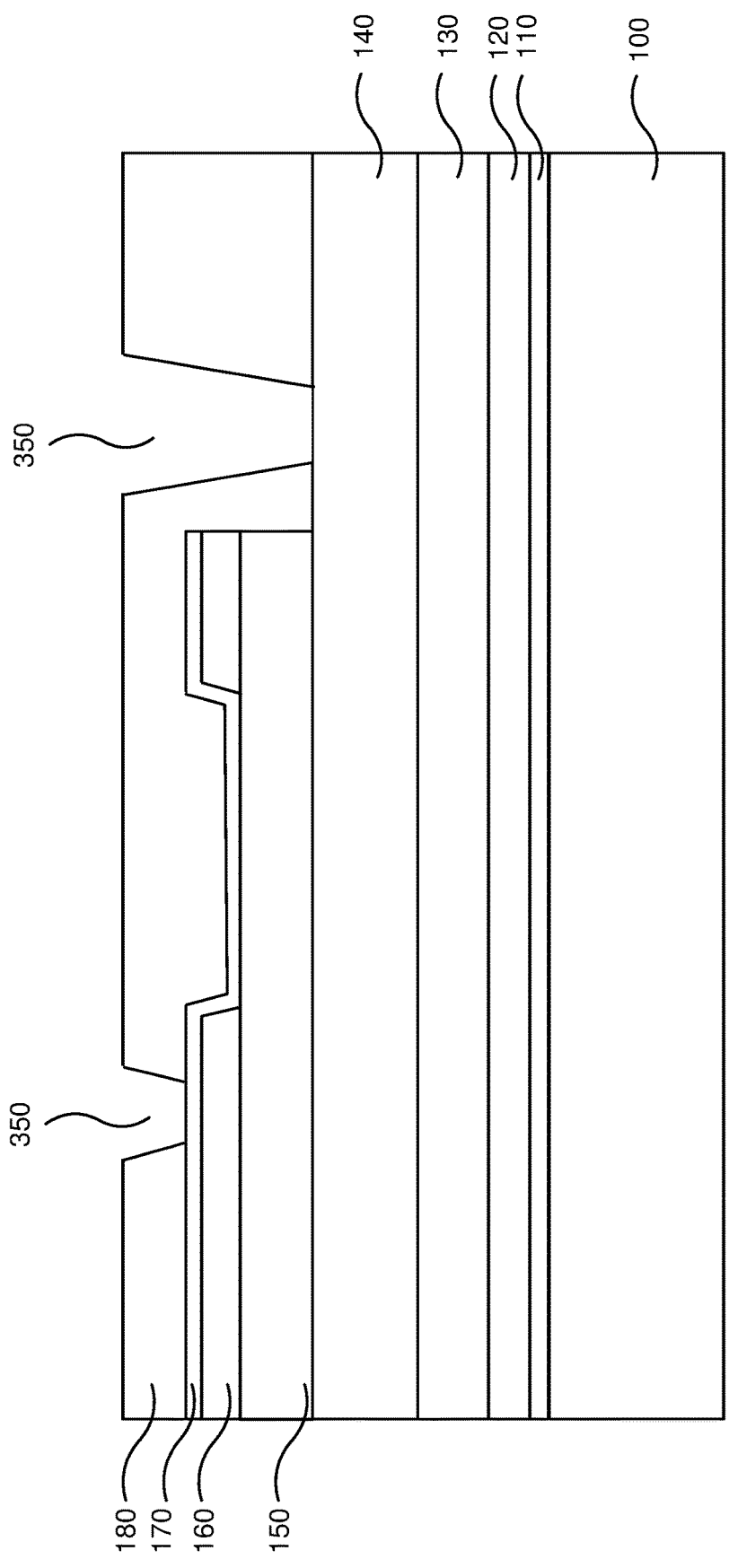

As illustrated in FIGS. 2 and 3F, in step S6, a sacrificial layer 180 is deposited on the structure in FIG. 3E, and is patterned by etching to form trench 350. The material of sacrificial layer 180 may be silicon oxide. Trench 350 surrounds a portion of sacrificial layer 180 which will be removed during a subsequent etching and releasing process, thereby forming bottom cavity 500a. Trench 350 is used to define the range of bottom cavity 500a. Trench 350 exposes a portion of bottom passivation layer 170 and a portion of piezoelectric layer 140.

Figure 3G:
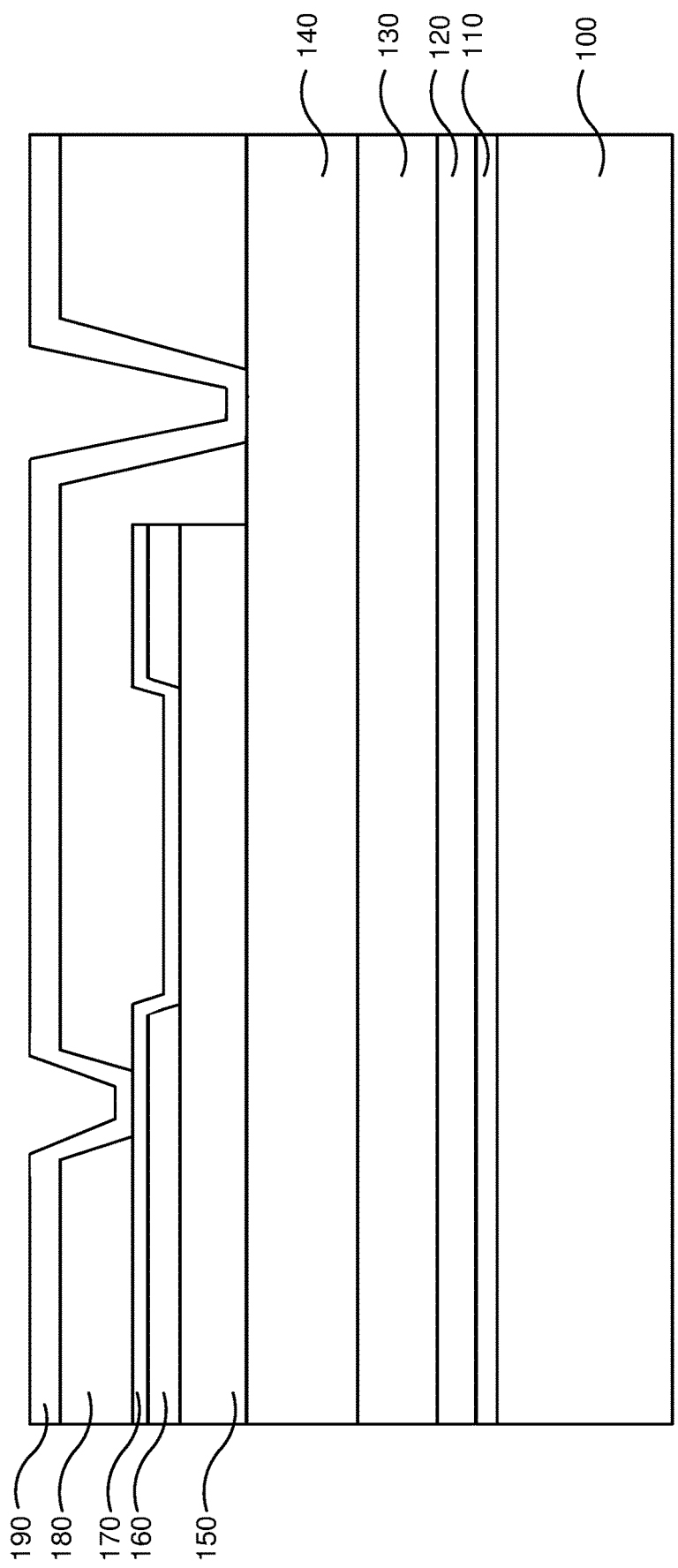

As illustrated in FIGS. 2 and 3G, in step S7, boundary layer 190 is deposited. The material of boundary layer 190 may be silicon (Si), silicon nitride (SiN), aluminum nitride (AlN), or other non-conductive materials, or a stacked combination of two or more of those materials. Boundary layer 190 is deposited in trench 350, thereby defining a stop boundary during the subsequent etching and releasing process for forming bottom cavity 500a.

Figure 3H:
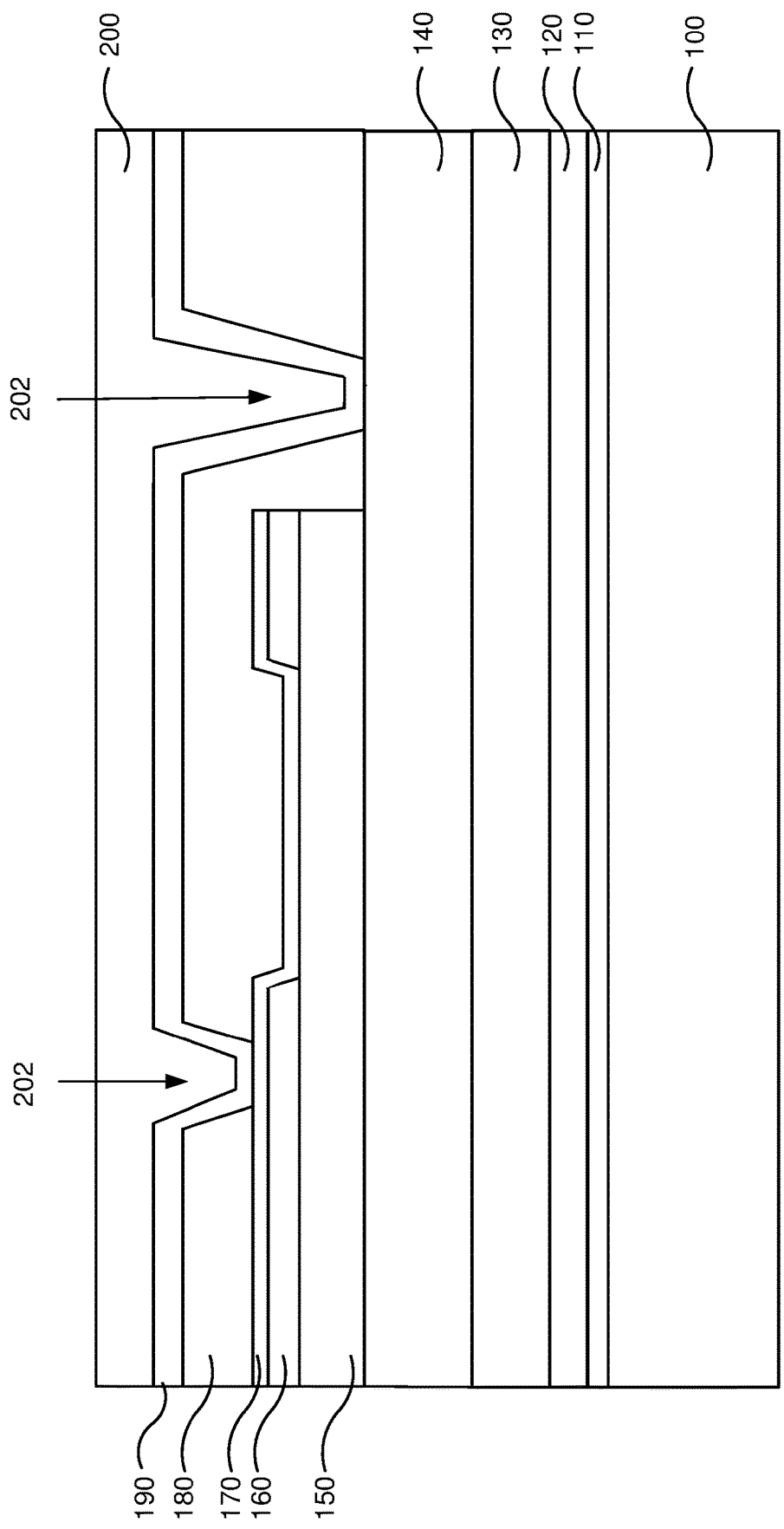

As illustrated in FIGS. 2 and 3H, in step S8, bottom bonding layer 200 is deposited on boundary layer 190, and fills in trench 350. Then, surface planarization and polishing are performed on bottom bonding layer 200. A portion of bottom bonding layer 200 that fills in trench 350 constitutes a protruding structure 202 that surrounds the part of sacrificial layer 180 which will be removed to form bottom cavity 500a. Bottom bonding layer 200 is used to bond bottom substrate 210. The material of bottom bonding layer 200 may be silicon oxide, silicon nitride, or other materials, or a stacked combination of two or more of these materials. In the present embodiment, silicon oxide is used for bottom bonding layer 200. The surface planarization and polishing may be achieved by a chemical mechanical polishing (CMP) process.

Figure 3I:
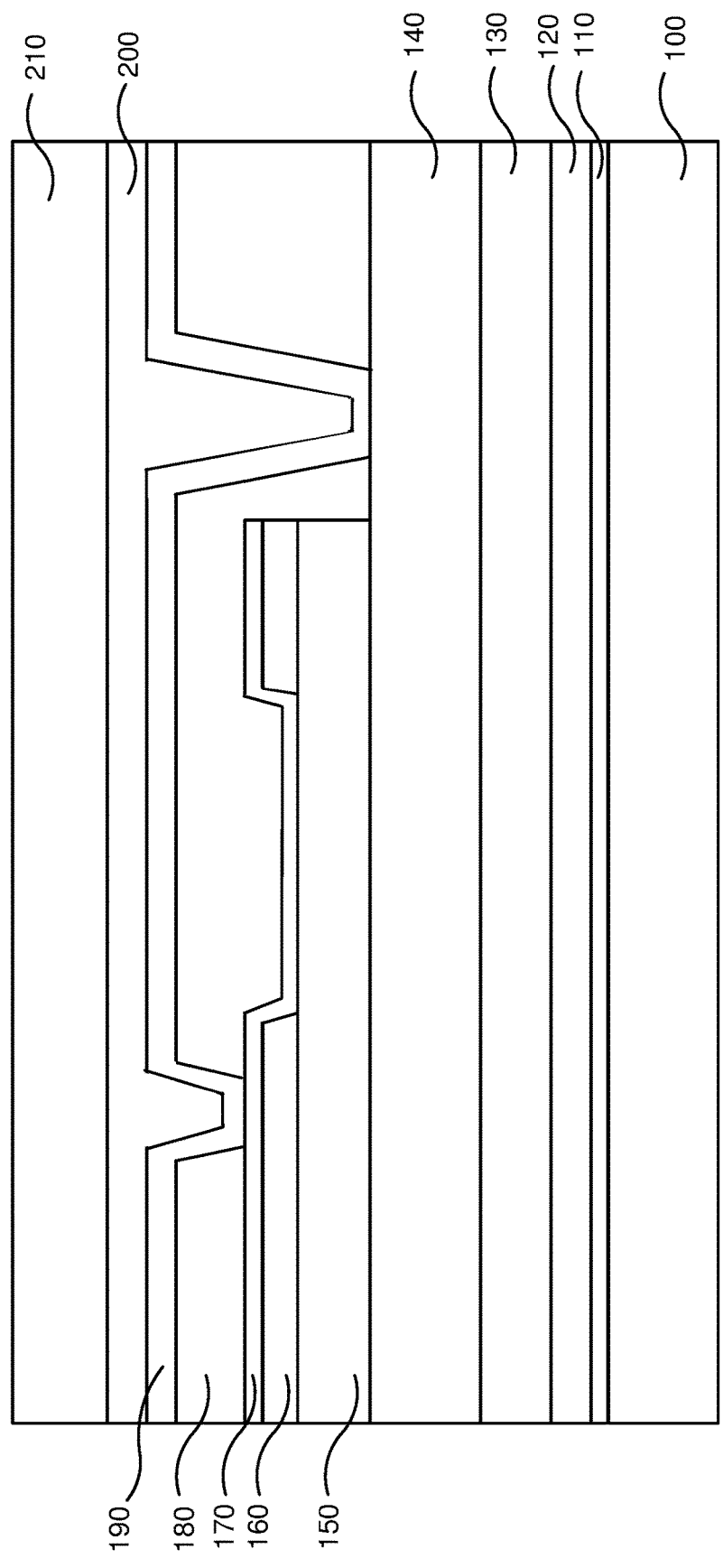

As illustrated in FIGS. 2 and 3I, in step S9, bottom substrate 210 is bonded to bottom bonding layer 200. Bottom substrate 210 may be a cap wafer that includes a material such as silicon (Si), carbon silicon (SiC), aluminum oxide, quartz, glass (SiO$_2$), or sapphire (Al$_2$O$_3$).

Figure 3J:
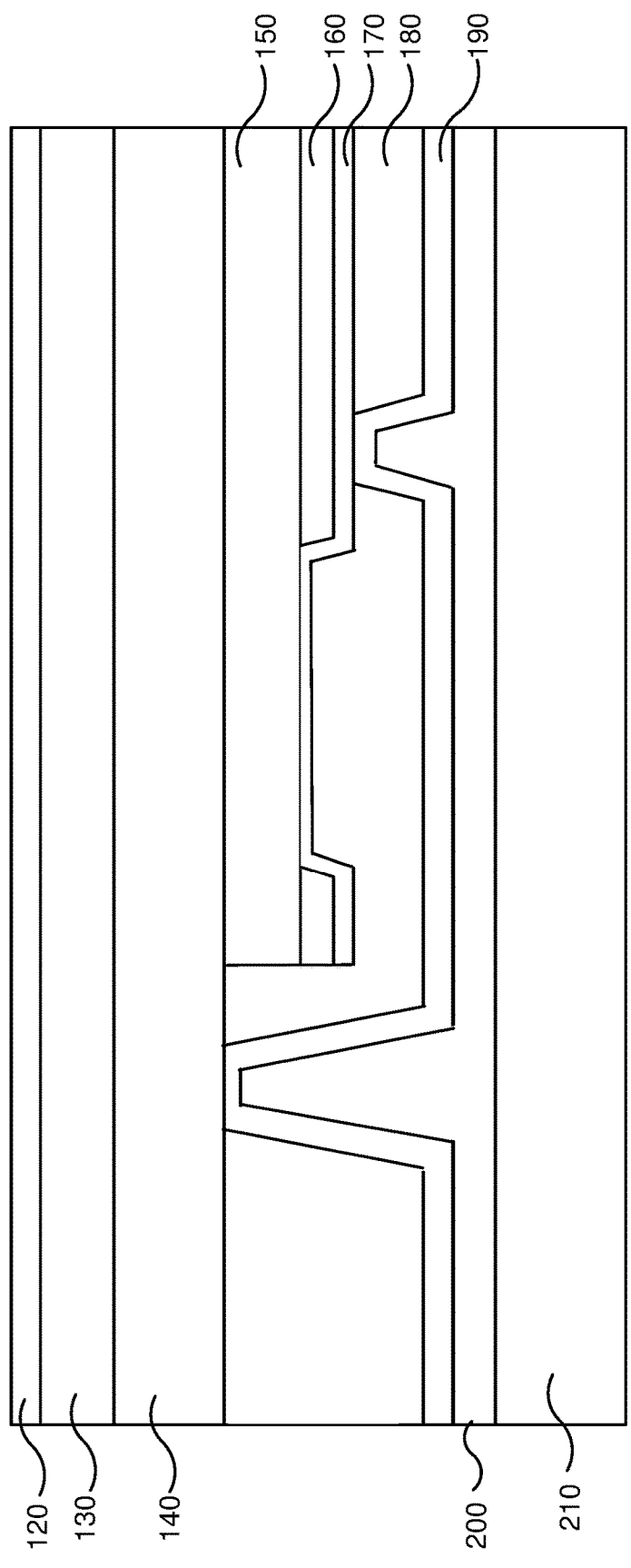

As illustrated in FIGS. 2 and 3J, in step S10, the structure illustrated in FIG. 3I is flipped over, and temporary substrate 100 and silicon oxide layer 110 are removed. The removing of temporary substrate 100 may be performed by a grinding process, a plasma dry etching process, a wet chemical etching process, or a combination thereof. In the present embodiment, temporary substrate 100 is made of silicon material, and is removed by a combination of grinding and wet chemical etching, or a combination of grinding and plasma dry etching. Silicon oxide layer 110 may be removed by plasma dry etching, wet chemical etching, or a combination of the two.

Figure 3K:
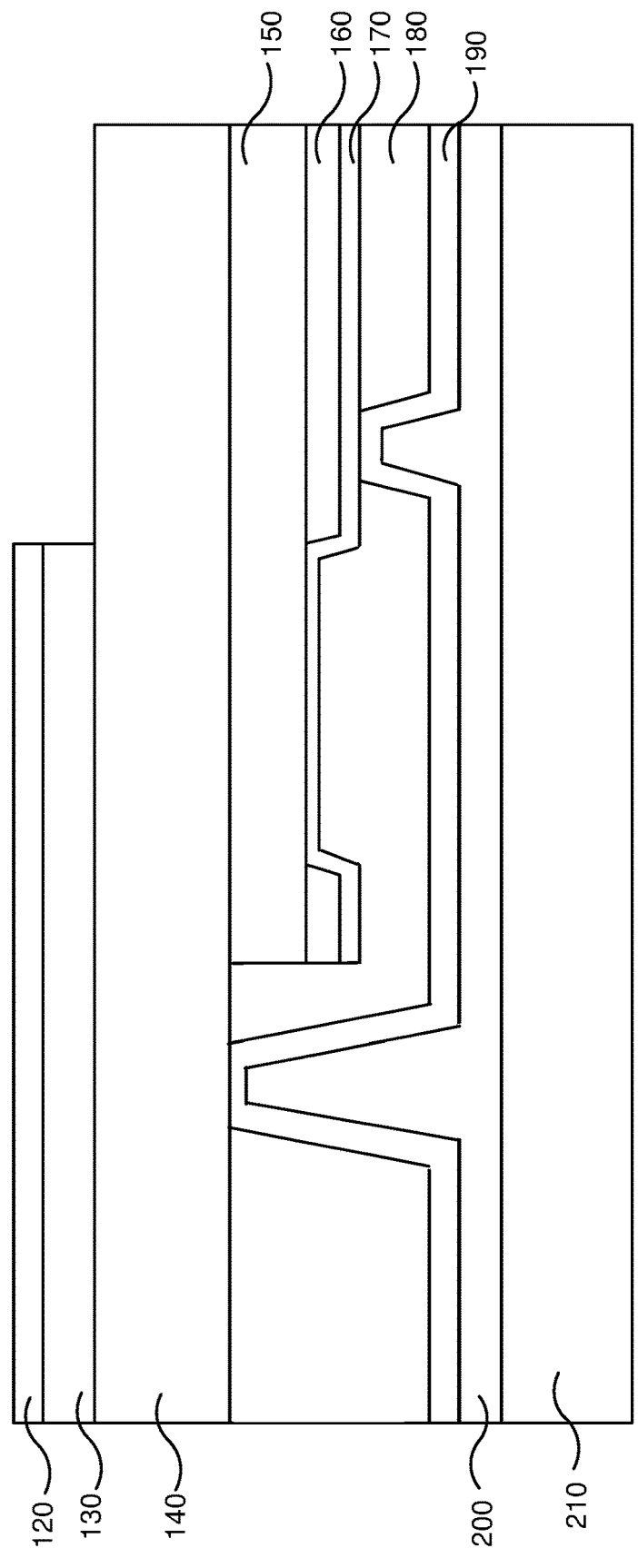

As illustrated in FIGS. 2 and 3K, in step S11, top passivation layer 120 and top electrode layer 130 are patterned by etching, to form patterned top passivation layer 120 and top electrode 130. The etching process may be a plasma etching process, a wet chemical etching process, or a combination of the two.

Figure 3L:
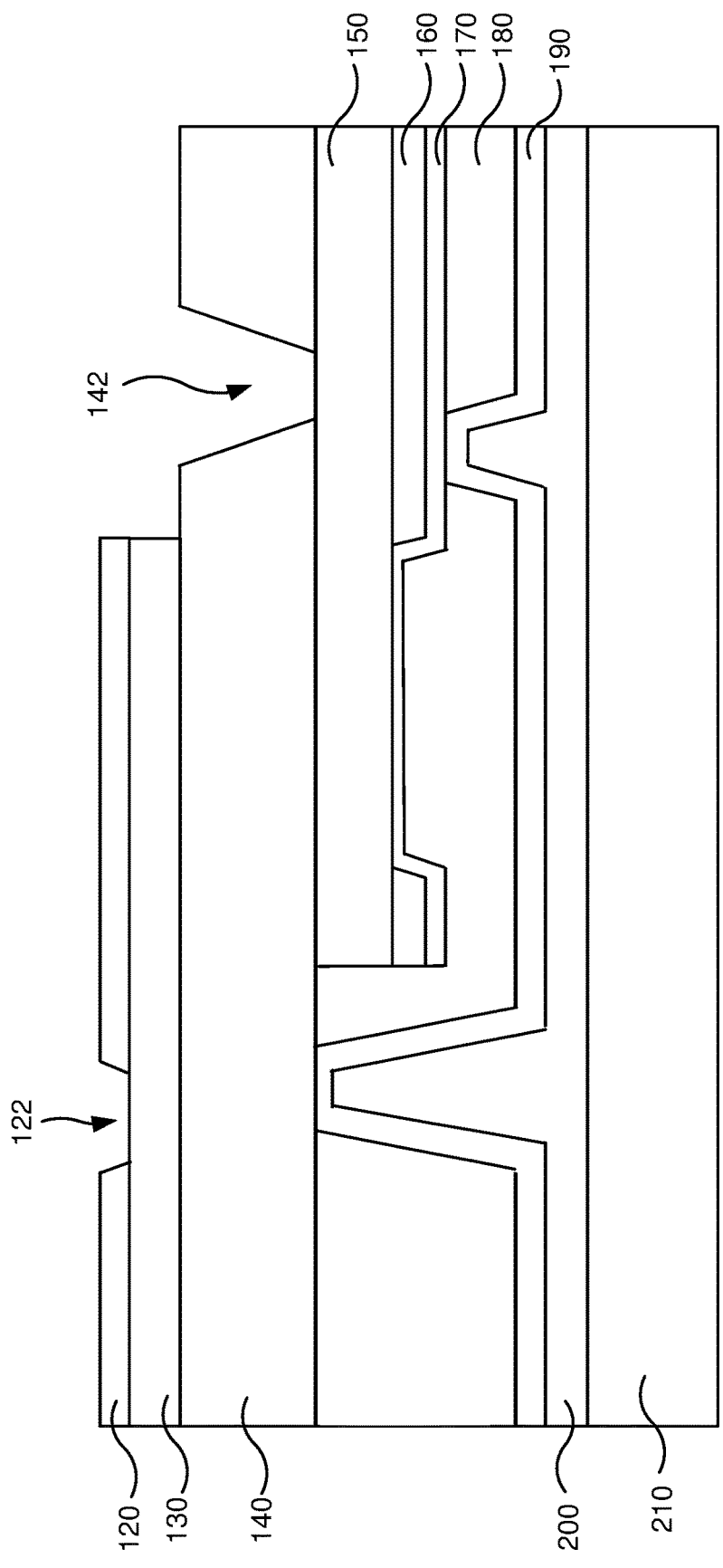

As illustrated in FIGS. 2 and 3L, in step S12, piezoelectric layer 140 is etched to form bottom electrode contact window 142 for bottom electrode 150, and top passivation layer 120 is etched to form top electrode contact window 122 for top electrode 130.

Figure 3M:
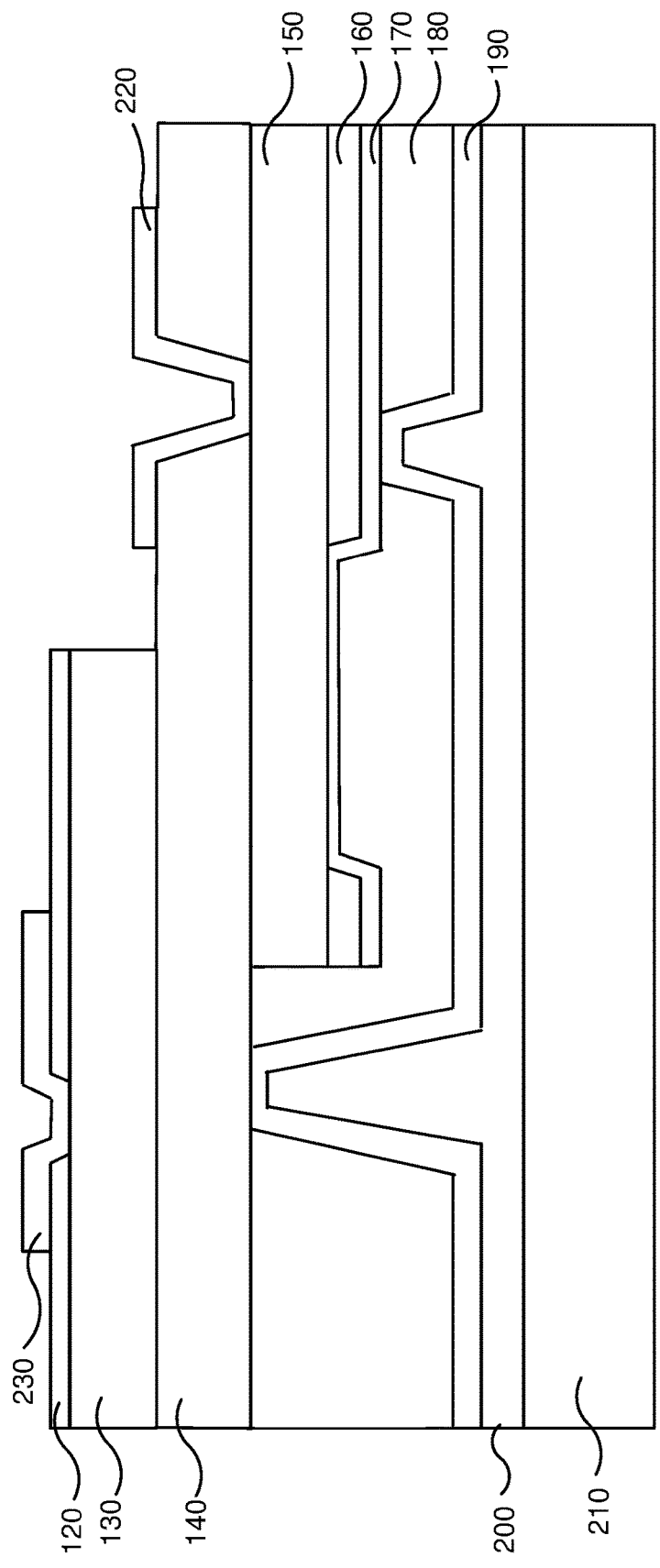

As illustrated in FIGS. 2 and 3M, in step S13, a metal layer is formed on the structure illustrated in FIG. 3L by vapor deposition. Then, the metal layer is patterned by lift-off to form first pad metal layer 230 and second pad metal layer 220. First pad metal layer 230 is formed on top passivation layer 120, and contacts top electrode 130 via top electrode contact window 122. Second pad metal layer 220 is formed on piezoelectric layer 140, and contacts bottom electrode 150 via bottom electrode contact window 142. Each one of first pad metal layer 230 and second pad metal layer 220 may include a stack of Cr/Au/Cr layers, or a stack of Ti/Au/Cr layers, arranged in an order from bottom to top.

Figure 3N:
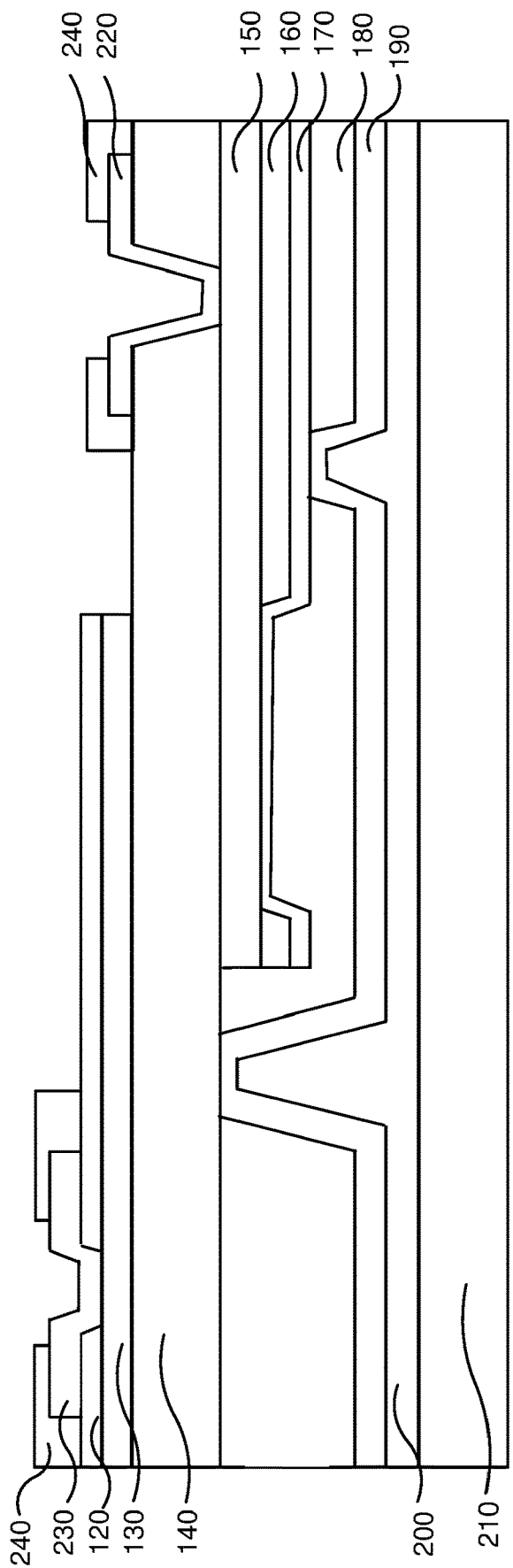

As illustrated in FIGS. 2 and 3N, in step S14, bond contacting layer 240 is formed on the structure illustrated in FIG. 3M by plasma enhanced chemical vapor deposition (PECVD) process. Then, bond contacting layer 240 is patterned by etching to partially cover first pad metal layer 230 and second pad metal layer 220. The patterned bond contacting layer 240 includes a space for forming top cavity 500b, and exposes portions of first pad metal layer 230 and second pad metal layer 220. Bond contacting layer 240 may include at least one of a silicon nitride ($SiN_x$) layer or a silicon oxide ($SiO_2$) layer.

Figure 3O:
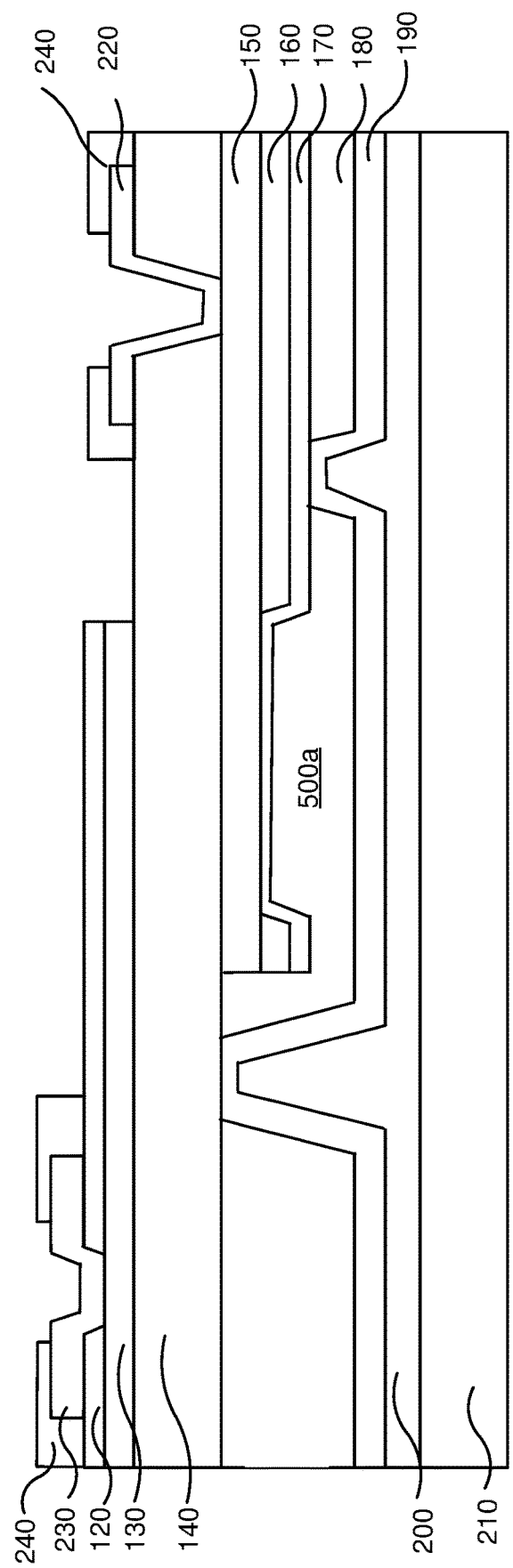

As illustrated in FIGS. 2 and 3O, in step S15, the portion of sacrificial layer 180 surrounded by protruding structure 202 is etched and released via a releasing hole (not shown) formed in piezoelectric layer 140, to form bottom cavity 500a. In the present embodiment, sacrificial layer 180 is made from silicon oxide, and the etching and releasing process of sacrificial layer 180 may be performed by using hydrofluoric acid solution wet etching, buffered oxide etchant (BOE) solution wet etching, or hydrofluoric acid vapor corrosion, or a combination of these processes. The etching of the sacrificial layer 180 stops at boundary layer 190.

As illustrated in FIGS. 2 and 3P, in step S16, cap wafer 250 is obtained. Then, top bonding layer 260 is formed on cap wafer 250, and is patterned to leave a space for top cavity 500b and leave spaces for top electrode through hole 401 and bottom electrode through hole 402.

Figure 3Q:
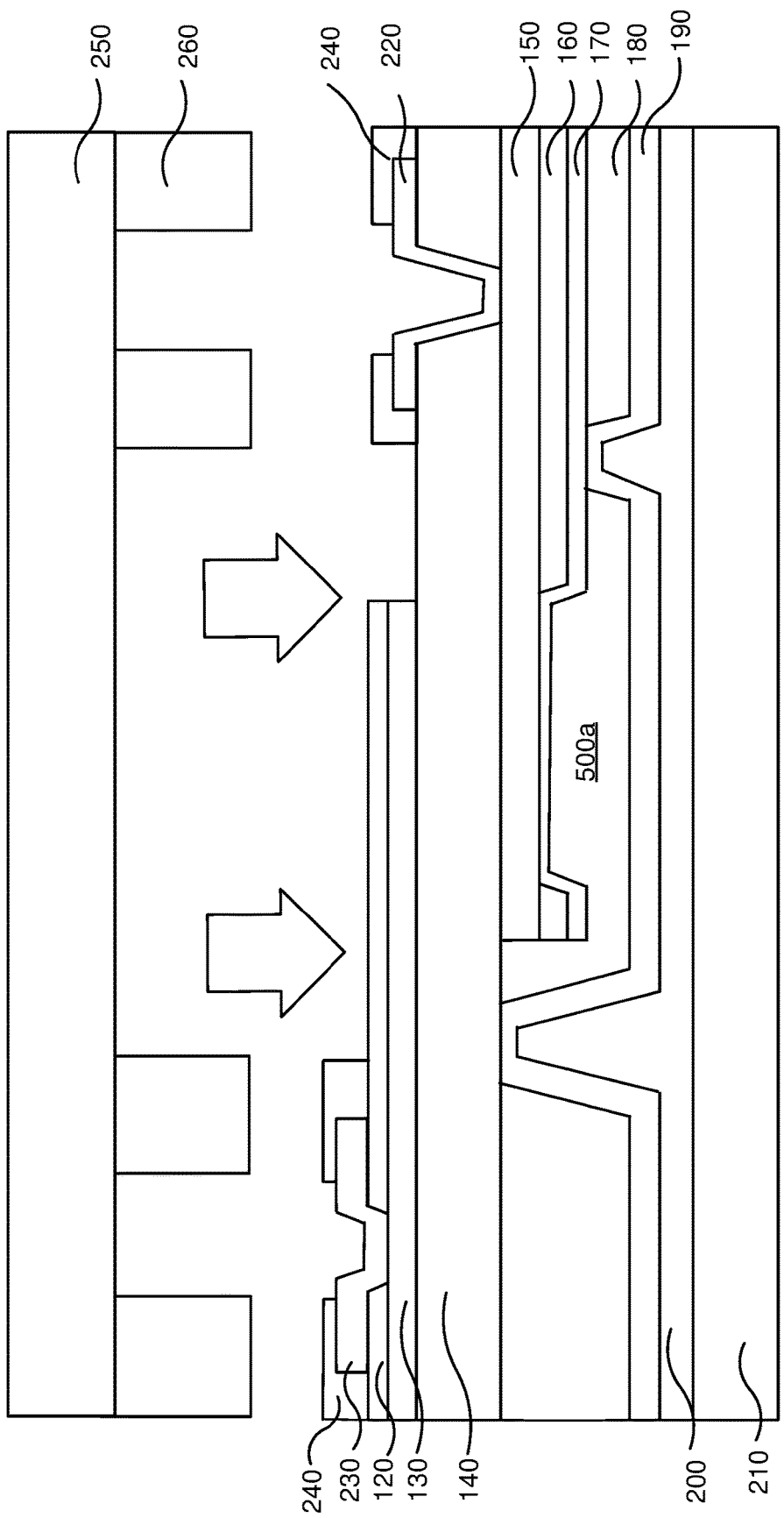

As illustrated in FIGS. 2 and 3Q, in step S17, cap wafer 250 formed with top bonding layer 260 is bonded to the structure illustrated in FIG. 3P via top bonding layer 260 and bond contacting layer 240.

Figure 3R:
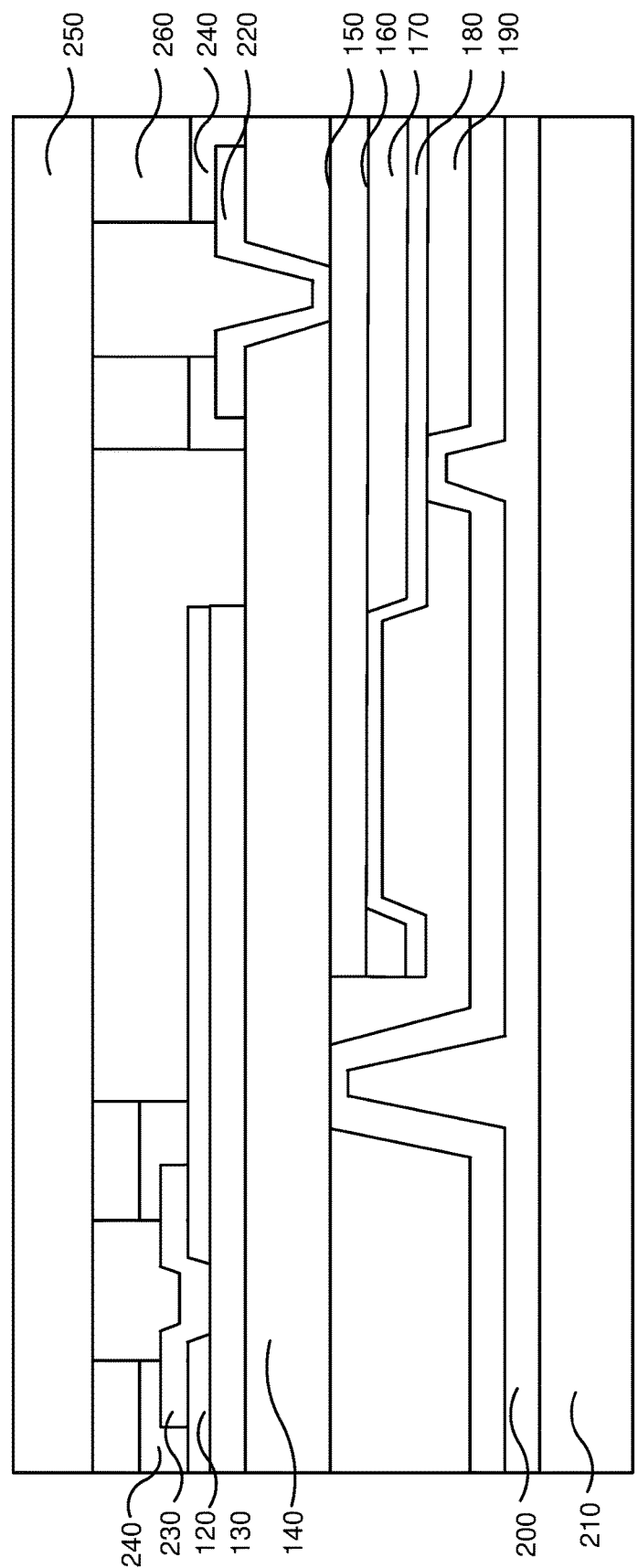

As a result, as illustrated in FIG. 3R, top cavity 500b is formed above piezoelectric layer 140 and is covered by cap wafer 250. Top cavity 500b is surrounded by top bonding layer 260 and bond contacting layer 240.

As illustrated in FIGS. 2 and 3S, in step S18, cap wafer 250 is etched to form top electrode through hole 401 and second electrode through hole 402. Top electrode through hole 401 extends through cap wafer 250, top bonding layer 260, and bond contacting layer 240 and exposes a portion of first pad metal layer 230. Second electrode through hole 402 extends through cap wafer 250, top bonding layer 260, and bond contacting layer 240, and exposes a portion of second pad metal layer 220.

Figure 3T:
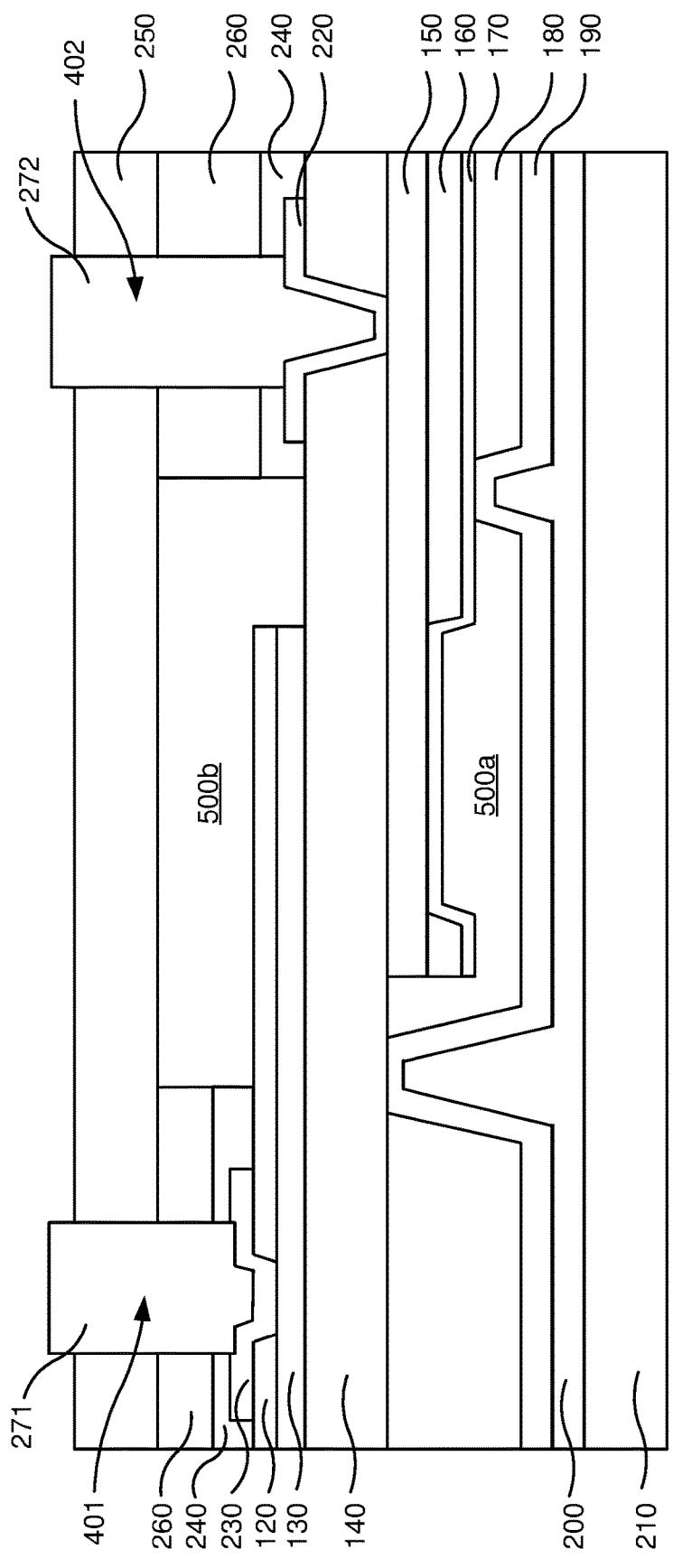
Figure 3U:
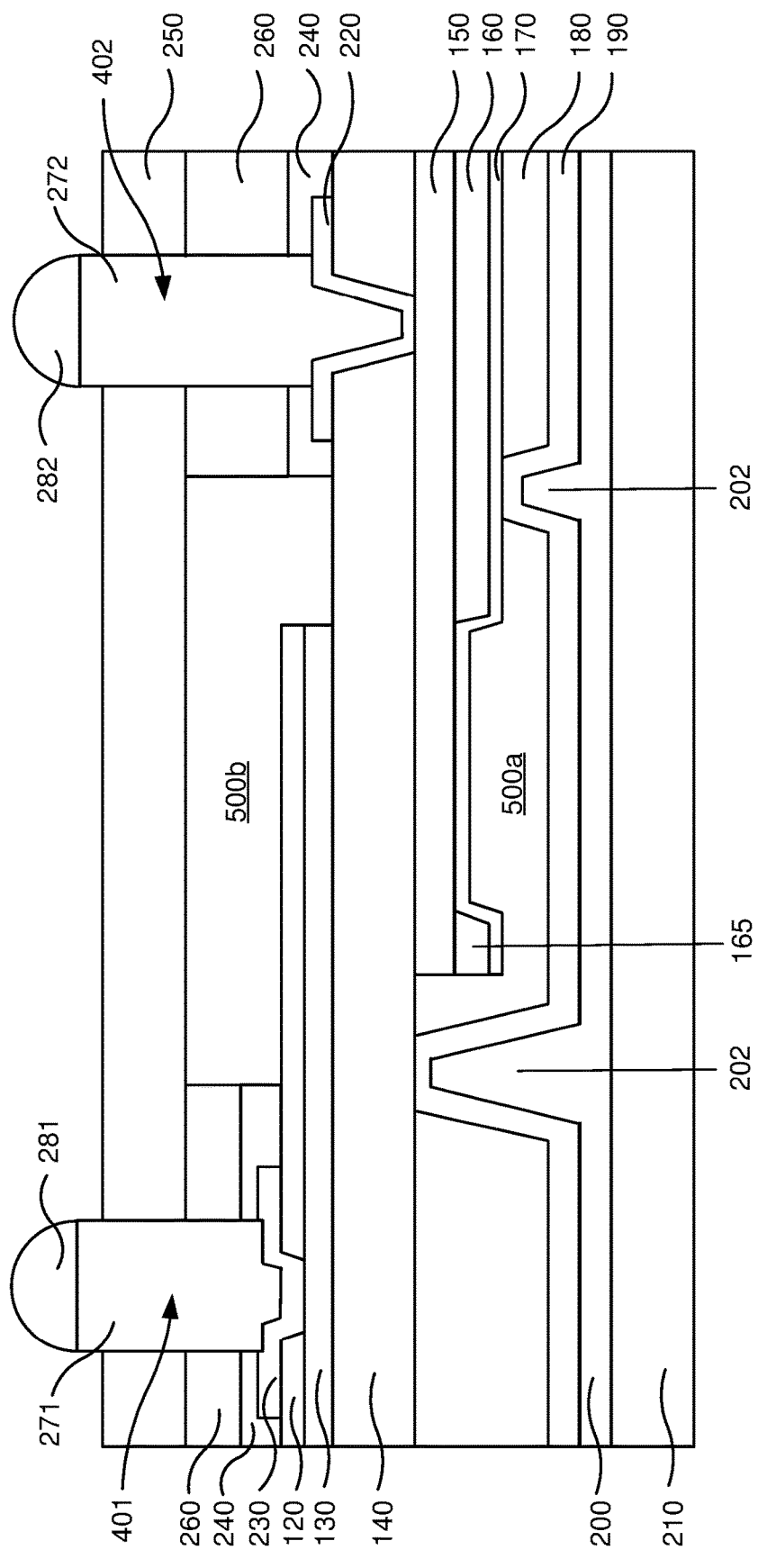

As illustrated in FIGS. 2 and 3T, in step S19, first and second metal fillings 271 and 272 are respectively filled in top and bottom electrode through holes 401 and 402. Metal fillings 271 and 272 may be made from a conductive metal material such as, for example copper (Cu).

As illustrated in FIGS. 2 and 3U, in step S20, first and second solder bumps 281 and 282 are respectively formed on top of first and second metal fillings 271 and 272. As a result, BAW resonator 1000 illustrated in FIG. 1 is fabricated.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bulk acoustic wave (BAW) resonator, comprising:
   a bottom substrate;
   a piezoelectric layer disposed above the bottom substrate;
   a cap wafer disposed above the piezoelectric layer;
   a top electrode disposed on the piezoelectric layer;
   a bottom electrode disposed below the piezoelectric layer;
   a first pad metal layer disposed between the top electrode and the cap wafer, and electrically connected to the top electrode;
   a second pad metal layer disposed between the bottom electrode and the cap wafer, and electrically connected to the bottom electrode;
   a top bonding layer disposed below the cap wafer, for bonding the cap wafer with the piezoelectric layer; and
   a bond contacting layer disposed between the top bonding layer and each one of the first pad metal layer and the second pad metal layer,
   wherein the top bonding layer includes a dry film, and the bond contacting layer includes at least one of a silicon nitride ($SiN_x$) layer or a silicon oxide ($SiO_2$) layer.

2. The BAW resonator of claim 1, wherein each one of the first pad metal layer and the second pad metal layer includes a stack of Cr/Au/Cr layers, arranged in an order from bottom to top.

3. The BAW resonator of claim 1, wherein each one of the first pad metal layer and the second pad metal layer includes a stack of Ti/Au/Cr layers, arranged in an order from bottom to top.

4. The BAW resonator of claim 1, further comprising:
   a sacrificial layer disposed between the bottom substrate and the piezoelectric layer; and
   a bottom cavity formed in the sacrificial layer.

5. The BAW resonator of claim 4, further comprising:
   a bottom bonding layer disposed between the bottom substrate and the sacrificial layer and including a protruding structure surrounding the bottom cavity; and
   a boundary layer overlying the bottom bonding layer.

6. The BAW resonator of claim 5, wherein the boundary layer contacts the piezoelectric layer or the bottom electrode.

7. The BAW resonator of claim 4, wherein an edge of the bottom electrode is located inside the bottom cavity.

8. The BAW resonator of claim 1, further comprising a top cavity disposed above the piezoelectric layer and covered by the cap wafer, the top cavity being surrounded by the top bonding layer and the bond contacting layer.

9. The BAW resonator of claim 8, wherein an edge of the top electrode is disposed within the top cavity.

10. The BAW resonator of claim 1, further comprising:
    a top electrode through hole extending through the cap wafer, the top bonding layer, and the bond contacting layer, and exposing a portion of the first pad metal layer; and
    a bottom electrode through hole extending through the cap wafer, the top bonding layer, and the bond contacting layer, and exposing a portion of the second pad metal layer.

11. The BAW resonator of claim 10, further comprising:
    a first bump filled in the top electrode through hole and electrically connected to the first pad metal layer; and a second bump filled in the bottom electrode through hole and electrically connected to the second pad metal layer.

12. The BAW resonator of claim 11, further comprising:
a first bump solder disposed on the first bump; and
second bump solder disposed on the second bump.

\* \* \* \* \*